(12) United States Patent
Mori

(10) Patent No.: US 7,101,749 B2
(45) Date of Patent: Sep. 5, 2006

(54) NON-VOLATILE SEMICONDUCTOR MEMORY DEVICE

(75) Inventor: Seiichi Mori, Tokyo-To (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/933,035

(22) Filed: Sep. 1, 2004

(65) Prior Publication Data
US 2005/0029579 A1 Feb. 10, 2005

Related U.S. Application Data

(63) Continuation of application No. 10/454,316, filed on Jun. 3, 2003, now abandoned, which is a continuation of application No. 09/456,873, filed on Dec. 8, 1999, now abandoned.

(30) Foreign Application Priority Data
Dec. 9, 1998 (JP) .............................. 10-350232

(51) Int. Cl.
H01L 21/33 (2006.01)
(52) U.S. Cl. ................ 438/201; 438/257; 257/315
(58) Field of Classification Search ......... 438/201, 438/211, 216, 257, 261, 266, 591, 593; 257/314–317, 257/324, 325, 406, 410
See application file for complete search history.

(56) References Cited

U.S. PATENT DOCUMENTS

| 5,374,847 A | 12/1994 | Araki et al. |
| 5,661,056 A | 8/1997 | Takeuchi |
| 5,731,238 A | 3/1998 | Cavins et al. |
| 5,793,081 A | 8/1998 | Tomioka et al. |
| 5,907,183 A | 5/1999 | Takeuchi |

FOREIGN PATENT DOCUMENTS

| JP | 02188970 A | 7/1990 |
| JP | 358106873 A | 6/1993 |

OTHER PUBLICATIONS

Wang, et al., "Dual Frequency Silicon Nitride Low Thermal Budget for Pre-Metal Dielectric Applications in Sub-0.25 μm Devices," IEEE/SEMI Advanced Semiconductor Manufacturing Conference, 1999, pp. 405-408.
Klein, et al., "Silicon Nitride PECVD at Low Temperature: Film Properties Plasma Physics," IEEE Plasma Science 25th Anniversary, Jun. 4, 1998, p. 215.

Primary Examiner—Leonardo Andujar
(74) Attorney, Agent, or Firm—Hogan & Hartson LLP

(57) ABSTRACT

A non-volatile semiconductor memory device according to the present invention has a semiconductor substrate and a memory cell having a floating gate provided through a tunnel insulating layer on the semiconductor substrate, and a control gate provided through an inter-layer insulting layer on said floating gate. The inter-insulating layer includes a silicon oxide layer contiguous to said floating gate, a first silicon nitride layer provided by a CVD method on the silicon oxide layer and a second silicon nitride layer provided on said first silicon nitride layer and having a lower trap density than that of the first silicon nitride layer. The inter-insulating layer may includes a silicon oxide layer contiguous to said floating gate and a silicon oxide layer deposited on said silicon oxide layer and having a quantity of hydrogen content on the order of $10^{19}/cm^3$ or less. The inter-insulating layer also may includes a silicon oxide layer serving as a layer contiguous to at least one of the floating gate and the control gate, and having a lower trap density than that of a silicon nitride layer formed by a CVD method.

5 Claims, 3 Drawing Sheets

NON-VOLATILE SEMICONDUCTOR MEMORY DEVICE

This is a continuation of application Ser. No. 10/454,316 filed Jun. 3, 2003 now abandoned, which is a continuation of application Ser. No. 09//456,873 filed Dec. 8, 1999, now abandoned. This application also claims benefit of priority under 35 U.S.C. §119 to Japanese Patent Application No. 10-350232, filed on Dec. 9, 1998.

BACKGROUND OF THE INVENTION

1. Field of the Invention

The present invention relates to a non-volatile semiconductor memory device including a memory cell having a stacked gate structure.

2. Description of the Background Art

What has hitherto been known as a non-volatile semiconductor memory device uses a memory cell structure on which a floating gate is provided through a tunnel insulating layer on a semiconductor substrate, and a control gate is stacked thereon through an inter-layer insulating layer. The inter-layer insulating layer of this memory cell normally involves the use of a so-called ONO (Oxide-Nitride-Oxide) structure composed of a silicon oxide layer, a silicon nitride layer and a silicon oxide layer.

FIGS. 4A and 4B show sections, taken in two directions orthogonal to each other, of the memory cell structure described above. Normally in a flash memory, the control gates of a plurality of memory cells are consecutively arranged and serve as word lines. FIG. 4A is the section in the direction parallel to a direction of the word line.

An element isolation insulating layer 2 is provided on a p-type silicon substrate 1, and a floating gate 4 is provided through a tunnel insulating layer 3 on a device region defined by the element isolation insulating layer 2. Provided on the floating gate 4 is an ONO layer 5 as an inter-layer insulating layer including a silicon oxide layer 5a, a silicon nitride layer 5b and a silicon oxide layer 5c which are stacked in this sequence. Further, a control gate 6 is provided on the ONO layer 5. Source/drain diffused layers 7, 8 are provided in self-alignment with the control gate 6.

The ONO layer 5 functions to prevent electric charges accumulated in the floating gate 3 from leaking out during a writing process to the memory cell, and, because of a necessity for confining the electric charges within the floating gate 4 over a long period of time, is required to exhibit a high insulating property. In the normal flash memory, the floating gate retains electrons. In an electron accumulating state, however, a comparatively weak electric field (a self electric field) generated by the electrons is applied to the ONO layer 5.

The silicon oxide layer 5a, on the side of the floating gate 4, of the ONO layer 5, if a layer thickness thereof is 5–6 nm, works as a Fowler-Nordheim type tunnel current conductive mechanism, wherein the electric current flowing with a low electric field is extremely small. Further, a barrier height of the silicon oxide layer 5a with respect to silicon is as high as 3.2 eV. Accordingly, if the silicon oxide layer 5a has no defect and there is no electric field enhancement effect based on a two-dimensional configuration of the floating gate 4, only the silicon oxide layer 5a must be capable of sufficiently retaining the electrons for a long time. In fact, however, there exist the defect and the two-dimensional electric field enhancement effect, and hence the ONO layer is used.

The two-dimensional electric field enhancement effect is typified by, for example, as indicated by a broken line A in FIG. 4A, an electric field enhancement at an edge which is obtained by forming the floating gate 4 in pattern. Further, there is an electric field enhancement caused by a rugged area formed on the surface of the floating gate 4 when the silicon oxide layer 5a is formed by thermal oxidation. The silicon nitride layer 5b of the ONO layer 5 contains much of trap level, and trapping occurs even when the electric current flows due to the electric field enhancement and acts to relieve the electric field, thereby restraining a leak of the electric charges from the oxide layer 5a surrounding the floating gate. If the oxide layer 5a has a defect, the same mechanism works. This is the reason why the silicon nitride layer 5b is used.

Incidentally, when the memory cell operates, and when in a state of the electrons being held by the floating gate, a positive bias is applied to the control gate 6. It is known that a large leak current flows to the silicon nitride layer through the trap level by hole conduction. Accordingly, supposing that the control gate 6 is provided directly on the silicon nitride layer 5b, the holes from the control gate 6 are injected, and therefore a dielectric strength is unable to be kept well. The silicon oxide layer 5c is provided upward in order to restrain the holes from being injected from the control gate 6.

The upper and lower silicon, oxide layers 5a, 5c of the ONO layer 5 are each required to have a thickness of 5–6 nm for exhibiting functions of relieving the electric field and preventing the leak. The silicon nitride layer 5b has a thickness on the order of 10 nm (converted into 5 nm in the case of the oxide layer). Hence, an equivalent oxide thickness of the ONO layer 5 is 15–16 nm thick.

There arise the following problems inherent in the inter-layer insulating layer based on the ONO structure described above.

First, it is desirable for enabling the memory cell to operate at a low voltage that a capacitance coupling between the control gate and the floating gate be large. It is desirable for attaining this that the ONO layer be as thin as possible. If the layer thickness is thinned down to a limit thereof, it can be thinned totally down to approximately 14 nm as an equivalent oxide thickness. However, further thinning of the layer becomes difficult.

Second, in the ONO layer, in a post-oxidating step after gate definition processing, as shown in FIG. 4B, a bird's beak B intrudes in a portion between the floating gate 4 and the control gate 6 from a side surface. The bird's beak decreases the capacitance coupling between the control gate 6 and the floating gate 4. Especially when the silicon oxide layer 5a disposed directly on the floating gate is provided by a CVD (Chemical Vapor Deposition) method, a characteristic of density thereof is inferior to a thermal oxide layer, and hence oxygen diffuses fast within the layer, with the result that a large bird's beak occurs. In the case of obtaining the silicon oxide layer at a low process temperature, the silicon oxide layer formed by the CVD method might be used more often than by the thermal oxidation, and therefore, in such a case, the intrusion of the bird's beak turns out a problem.

SUMMARY OF THE INVENTION

It is therefore a primary object of the present invention to provide a non-volatile semiconductor memory device including an inter-layer insulating layer, which is capable of ensuring even a large capacitance coupling between a control gate and a floating gate while securing an electric field relieving effect and a leak preventive function.

According to the present invention, a silicon nitride layer having a trap level density well lower than that of a silicon nitride layer formed by a normal CVD (Chemical Vapor Deposition), especially LPCVD (Low Pressure Chemical Vapor Deposition) method, is provided in the inter-layer insulating layer, whereby a large capacitance coupling between a control gate and a floating gate can be ensured by making an effective thickness of an oxide layer smaller than in the prior art while exhibiting an electric field relieving effect and a lead reducing effect. Furthermore, if such a silicon nitride layer is disposed contiguously to the control gate or the floating gate, an intrusion of a bird's beak can be restrained from occurring in a post-oxidation step, and it is therefore feasible to ensure the large capacitance coupling between the control gate and the floating gate.

DETAILED DESCRIPTION OF THE PREFERRED EMBODIMENTS

Embodiments of the present invention will hereinafter be described with reference to the accompanying drawings.

First Embodiment

Figure 1A:
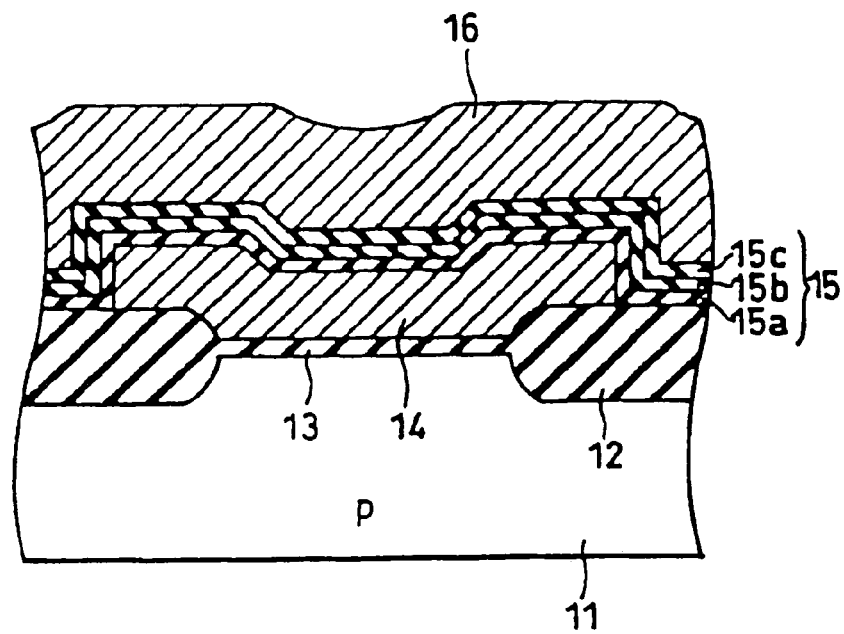
FIGS. 1A and 1B are sectional views each showing a memory cell structure in a first embodiment of the present invention.
Figure 1B:
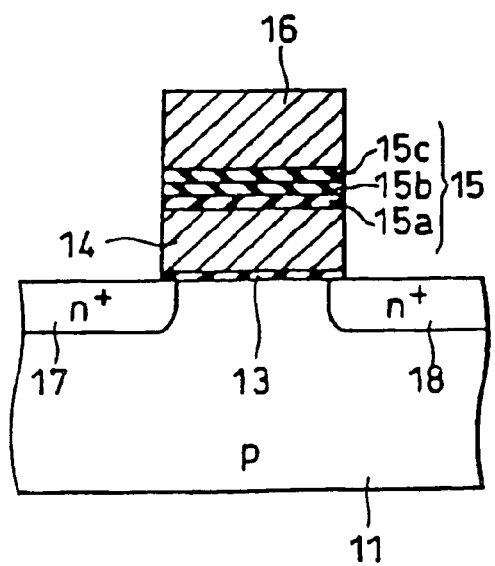

FIGS. 1A and 1B are sectional views taken in direction orthogonal to each other, showing a memory cell structure of a non-volatile semiconductor memory device in a first embodiment of the present invention. An element isolation insulating layer 12 is provided on a p-type silicon substrate 11, and a floating gate 14 composed of a polycrystalline silicon layer is provided through a tunnel insulating layer 13 on a device area defined by the element isolation insulating layer 12. The tunnel insulating layer 13 is classified as a silicon oxide layer. A control gate 16 composed of a polycrystalline silicon layer is stacked on the floating gate 14 via an inter-layer insulating layer 15. Source/drain diffused layers 17, 18 are so provided on the substrate as to be self-aligned with the control gate 16.

The inter-layer insulating layer 15 includes a silicon oxide layer 15a contiguous to the floating gate 14, and double-layered silicon nitride layers 15b, 15c provided thereon. The first silicon nitride layer 15b is provided by a normal CVD method, especially low pressure (LP) CVD method, and the second silicon nitride layer 15c is provided by a JVD (Jet vapor Deposition) method. The second silicon nitride layer 15c is well lower in trap level density than the first silicon nitride layer 15b and has a less leak current at a low electric field region.

Specifically, the silicon oxide layer 15a is a thermal oxide layer obtained by thermally oxidating the floating gate 14, or a silicon oxide layer based on the LPCVD method. The first silicon nitride layer 15b is formed by the LPCVD method, wherein dichlorosilane ($SiH_2C_{l2}$) and ammonia ($NH_4$) are used as raw gases. The second silicon nitride layer 15c is formed such that active Si and N are generated by plasma-decomposing a silane-series gas (e.g., $SiH_4$) supplied together with a carrier gas such as He etc. and a gas (e.g., $N_2$) containing nitrogen by microwave electric power, and supplied and deposited by the JVD method on the surface of the substrate disposed within a chamber. It has already been reported that the silicon nitride layer exhibiting a low trap level density is obtained by the JVD method (refer to, e.g., Applied Surfaces Science 177/118 (1997) 259–267). Herein, a quantity of hydrogen content of the first silicon nitride layer 15b deposited by the LPCVD method is $10^{21}/cm^3$ or more, while a quantity of hydrogen content of the second silicon nitride layer 15c deposited by the JVD method is $10^{19}/cm^3$ or less. This difference in quantity of hydrogen content therebetween correlates to magnitudes of the trap level densities of those two layers, and, in other words, the silicon nitride layer having a less quantity of hydrogen content, which is deposited by the JVD method, exhibits a low trap level density and has a smaller leak current at the low electric field region.

Note that the silicon nitride layers deposited by other deposition methods may also be used on condition that those layers have a quantity of hydrogen content which is as small as the silicon nitride layer deposited by the JVD method, and exhibit a low trap level density.

Next, the reason why a structure of the inter-layer insulating layer 15 described above will be specifically elucidated as well as explaining a preferable thickness of each layer.

In the single layer 15c of the silicon nitride layer deposited by the JVD method, Frenkel-Poole type current, though not so much as the silicon nitride layer deposited by the LPCVD method, flows across the low electric field region, and hence this layer 15 is hard to be used solely as an inter-layer insulating layer. Further, the silicon nitride layer has a lower barrier height with respect to silicon than the silicon oxide layer, and is therefore insufficient as a barrier against a release of the electrons from the floating gate. Accordingly, it is required for forming the inter-layer insulating layer that the silicon oxide layer 15a be disposed just on, e.g., the floating gate 14. The silicon oxide layer 15a requires a thickness on the order of 5–6 nm for keeping a sufficient dielectric strength.

This first silicon nitride layer 15b provided based on the LPCVD method is needed for preventing the lead as well as for obtaining the electric field relieving effect. That is, the first silicon nitride layer 15b exhibits a high trap density and a Frenkel-Poole type electric conductive characteristic. In this Frenkel-Poole type electric conduction, the current in a high electric field region is small, and the current becomes hard to flow through a layer containing a trap because of the carriers being trapped even when the current flows therethrough at an initial stage. Therefore, the first silicon nitride layer 15b restrains an increase in the leak current due to the electric field enhancement at the edge taking a two-dimensional configuration of the floating gate 14. It is preferable for exhibiting the sufficient electric field relieving effect that the thickness of the silicon nitride layer 15b be over 6 nm. It is also preferable for ensuring a large capacitance coupling that the above thickness be under 10 nm, to be specific, on the order of 8 nm.

The second silicon nitride layer 15c based on the JVD method functions to restrain the hole implantation from the control gate 16. Namely, the first silicon nitride layer 15b based on the LPCVD method is easy to flow the Frenkel-Poole type Hall current. If the silicon nitride layer 15b is contiguous directly to the control gate 6, as described above, the large leak current flows due to the hole implantation from the control gate 16 in such an operation mode that the control gate 16 comes to have a positive bias. The second silicon nitride layer 15c based on the JVD method has an extremely low trap density and effectively restrains the hole implantation from the control gate 16. It is preferable for exhibiting this function that the second silicon nitride layer 15c be over 6 nm thick. It is also preferable for ensuring a large capacitance coupling that the thickness thereof be under 10 nm. Specifically, for example, the thickness of the silicon oxide layer 15a is set to 6 nm, and the thicknesses pf the silicon nitride layers 15a, 15b are each set to 6 nm (3 nm in the conversion of the oxide layer), and the effective thickness of the oxide layer is 12 nm. Accordingly, the layer can be made thinner than in a case of using the conventional ONO structure, and besides the sufficient electric field relieving effect can be obtained. Further, the silicon nitride layer 15c is the uppermost layer of the inter-layer insulating layer 15, and therefore it is feasible to restrain the intrusion of the bird's beak when effecting the post-oxidation.

Second Embodiment

Figure 2:
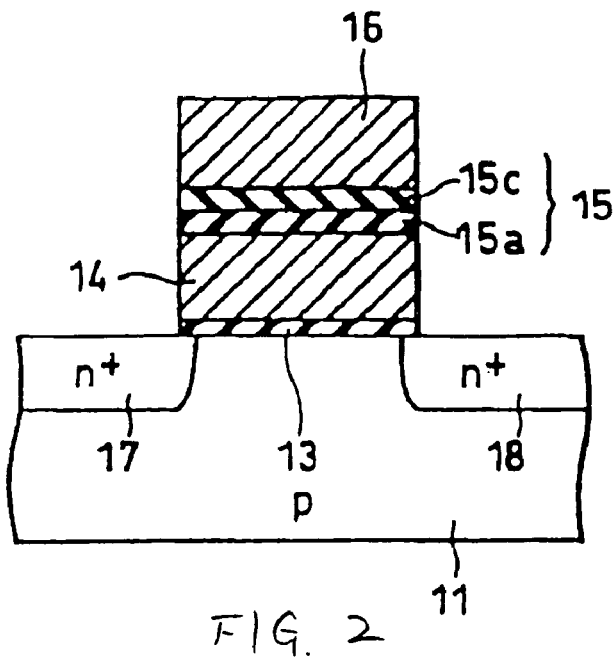
FIG. 2 is a sectional view showing a memory cell structure in a second embodiment of the present invention.

FIG. 2 shows, corresponding to FIG. 1B, a memory cell structure in a second embodiment of the present invention.

In the second embodiment of the present invention, the inter-layer insulating layer 15 is double-layered including two layers, i.e., from the side of the floating gate 14, the silicon oxide layer 15a and the silicon nitride layer 15c based on the JVD method which has a low trap density and a hydrogen content quantity on the order of $10^{19}/cm^3$ or less.

In the first embodiment, the silicon nitride layer 15b based on the LPCVD method and exhibiting the Frenkel-Poole type conduction, is disposed in the middle of the interlayer-insulating layer 15. If not operated with a high electric field, however, the silicon nitride layer 15b is not necessarily used. Namely, as shown in FIG. 2, for the purpose of blocking a defect in the lowermost silicon oxide layer 15a, the insulating layer may take a double-layered structure consisting of the silicon oxide layer 15a ad the silicon nitride layer 15c based on the JVD method and exhibiting the low trap density.

In the case of the silicon nitride layer formed by the normal LPCVD method and containing much of trap, the effect produced by use of the silicon nitride layer can not be expected due to a large quantity of holes injected from the control gate only with the double-layered structure of the silicon oxide layer and the silicon nitride layer. When using the silicon nitride layer based on, e.g., the JVD method, there is almost no hole conduction, and hence the above effect can be sufficiently obtained even with the double-layered structure.

Third Embodiment

For preventing the bird's beak from intruding into the inter-layer insulting layer due to the post-oxidation, the silicon nitride layer formed by the JVD method and having a hydrogen content quantity on the order of $10^{19}/cm^3$ or less, is provided keeping its thickness as thin as approximately 3 nm directly on the floating gate (i.e., the lowermost layer of the inter-layer insulating layer) or just under the control gate (viz., the uppermost layer of the inter-layer insulating layer). If a layer based on the normal LPCVD method and exhibiting a high trap density is used as this silicon nitride layer, a threshold value of the memory cell might become unstable due to the trap and release of the electric charges within the layer. If the silicon nitride layer deposed by the JVD method and having a low trap density is used, however, the instability of the threshold value never occurs.

FIGS. 3A–3D show an extraction of only the structure of the inter-layer insulating layer in the third embodiment.

Figure 3A:
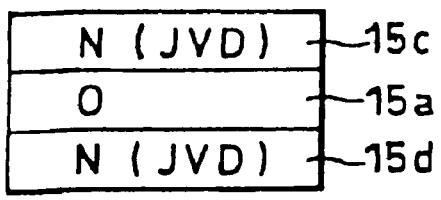
FIGS. 3A–3D are sectional views showing a structure of an inter-layer insulating layer of the memory cell in a third embodiment of the present invention.

FIG. 3A shows an example in which a silicon nitride layer 15d based on the JVD method is added as a layer contiguous to the floating gate 14 to a structure of the inter-layer insulating layer 15 in FIG. 15. A similar silicon nitride layer 15c serving as a layer contiguous to the control gate 16 is also provided, and the silicon oxide layer 15a is interposed between the nitride layers 15c and 15d, thereby structuring the inter-layer insulating layer 15.

Figure 3B:
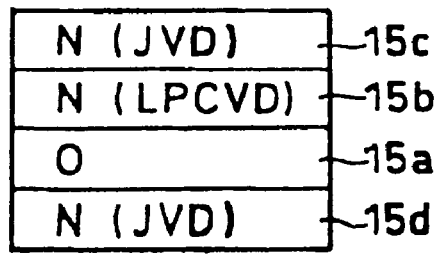

FIG. 3B shows an example in which the silicon nitride layer 15d formed by the JVD method is likewise added as a layer contiguous to the floating gate 14 to the structure of the inter-layer insulating layer 15 in FIG. 1. In this case also, the similar silicon nitride layer 15c serving as a layer contiguous to the control gate 16 is also provided, and a stacked layer of the silicon oxide layer 15a and the silicon nitride layer 15b formed by the LPCVD method, is interposed between the nitride layers 15c and 15d.

Figure 3C:
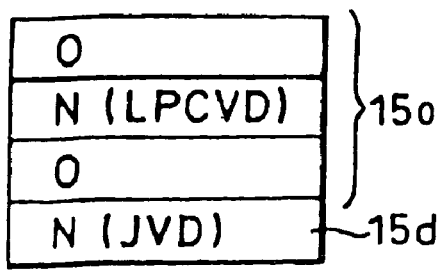

FIG. 3C shows an example in which the silicon nitride layer 15d formed by the JVD method is likewise added as a layer contiguous to the floating gate 14 to a normal- ONO-structured inter-layer insulating layer 150. More specifically, the stacked layer 150 consisting of the silicon oxide layer, the silicon nitride layer based on the LPCVD method and the silicon oxide layer, is superposed further on the silicon nitride layer 15d.

Figure 3D:
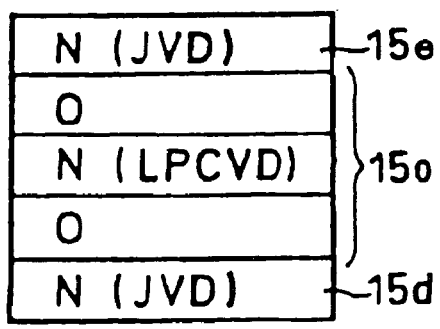
Figure 4A:
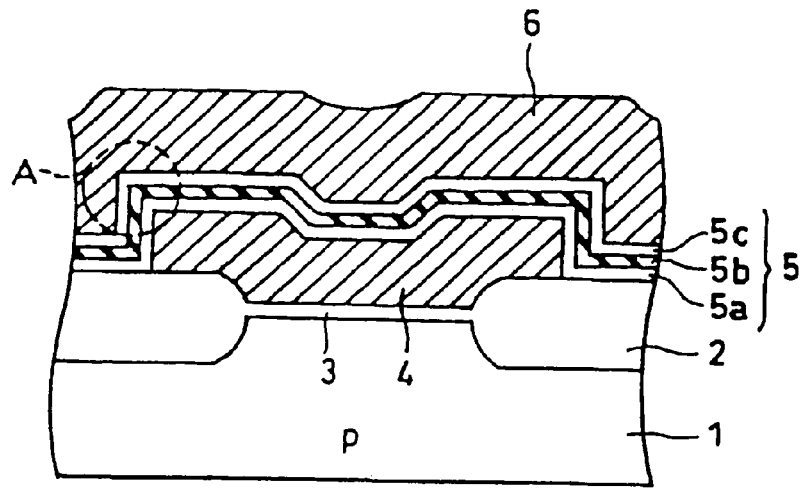
FIGS. 4A and 4B are sectional views each showing a memory cell structure of a non-volatile memory in the prior art.
Figure 4B:
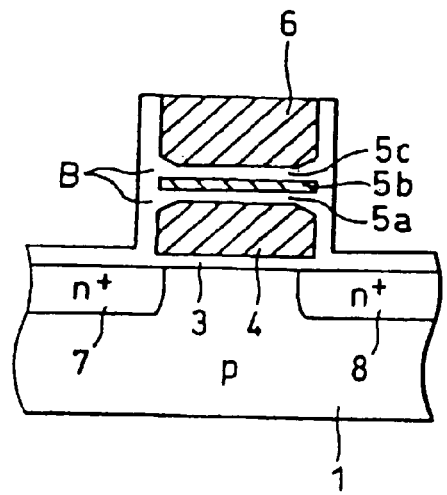

FIG. 3D shows an example in which silicon nitride layers 15d, 15e formed by the JVD method are stacked as layers contiguous to the floating gate 14 and the control gate 16, on the normal NON-structured inter-layer insulating layer 150. That is, the silicon nitride layer 15e is superposed further on the NON structured inter-layer insulating layer 150.

The third embodiment also exhibits the same effects.

According to the present invention, the silicon nitride layer having the trap level that is well lower than that of the silicon nitride layer based on the normal LPCVD method, is provided in the inter-layer insulating layer of the non-volatile memory cell having the stacked gate structure, whereby the large capacitance coupling between the control gate and the floating gate can be ensured by making the effective thickness of the oxide layer smaller than in the priori art while exhibiting the electric field relieving effect and the effect of reducing the leak.

What is claimed is:

1. A method of manufacturing a non-volatile semiconductor memory device, the method comprising:
    providing a semiconductor substrate; and
    forming a memory cell having a floating gate provided through a tunnel insulating layer on the semiconductor substrate, and a control gate provided through an inter-layer insulating layer on the floating gate, the inter-layer insulating layer having a silicon oxide film layer stacked on the floating gate, a first silicon nitride film layer stacked on the silicon oxide film layer and a second silicon nitride film layer stacked on the first silicon nitride layer;
    wherein the first silicon nitride film layer is formed by a low pressure CVD method, and the second silicon nitride film layer is formed by a JVD method.

2. The manufacturing method of claim 1, wherein the JVD method including obtaining active Si and N by plasma-decomposing at least a silane-series gas and a gas containing nitrogen.

3. The manufacturing method of claim 1, wherein the first silicon nitride film layer has a concentration of hydrogen on the order of $10^{21}/cm^3$ or more.

4. The manufacturing method of claim 3, wherein the second silicon nitride film layer has a concentration of hydrogen on the order of $10^{19}/cm^3$ or less.

5. The manufacturing method of claim 1, wherein the thickness of the silicon oxide film layer is set to 6 nm and the thicknesses of the first and second silicon nitride layers are each set to 6 nm.

* * * * *